(12) United States Patent
Chi

(10) Patent No.: US 6,946,910 B2
(45) Date of Patent: Sep. 20, 2005

(54) CONFIGURABLE FEEDBACK PATH IN AN AMPLITUDE CONTROL SYSTEM

(75) Inventor: Chen-Yu Chi, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 410 days.

(21) Appl. No.: 10/230,468

(22) Filed: Aug. 29, 2002

(65) Prior Publication Data

US 2004/0207447 A1 Oct. 21, 2004

(51) Int. Cl.[7] ............................................... H03F 3/45
(52) U.S. Cl. .................. 330/254; 340/635; 330/207 R; 330/282; 330/86; 330/279; 330/103; 327/323
(58) Field of Search ...................... 330/254, 207 R, 330/282, 75, 279, 86, 103, 149; 340/635; 327/306, 308, 318, 323

(56) References Cited

U.S. PATENT DOCUMENTS

| | | | |
|---|---|---|---|
| 4,996,500 A | | 2/1991 | Larson et al. |
| 5,486,791 A | * | 1/1996 | Spitalny et al. ............. 330/282 |
| 5,555,456 A | * | 9/1996 | Waite .......................... 340/635 |
| 5,661,442 A | | 8/1997 | Sparks |
| 6,020,787 A | * | 2/2000 | Kim et al. ................... 330/279 |

OTHER PUBLICATIONS

IEEE Standard Dictionary of Electrical and Electronics Terms Third Edition John Wiley & Sons, Inc. pp 471 and 662.*
Agilent Technologies, Inc.—Agilent TC677, GaAs Integrated 0.01–75 GHz Directional Detector; 1GG5–4047 Data Sheet; 3 Pages.

* cited by examiner

Primary Examiner—Michael B Shingleton
(74) Attorney, Agent, or Firm—John L. Imperato

(57) ABSTRACT

A configurable feedback path is included in an amplitude control system having a signal source and an amplitude controller, and provides accurate tracking between a signal provided at a test port and a reference signal, whether or not the configurable feedback path is in an internally-leveled configuration or an externally-leveled configuration. The configurable feedback path includes a series of access ports, a detector that has an input coupled to the first access port, a filtered output coupled to the amplitude controller, and an unfiltered output providing the reference signal. The configurable feedback path also includes a signal separator that has an input terminal coupled to the signal source, a thru-terminal coupled to the third access port, and a coupled terminal that is coupled to the second access port. The fourth access port is coupled to the test port.

7 Claims, 7 Drawing Sheets

CONFIGURABLE FEEDBACK PATH IN AN AMPLITUDE CONTROL SYSTEM

FIELD OF THE INVENTION

This invention relates to signal generators, and particularly, to amplitude control systems of signal generators.

BACKGROUND OF THE INVENTION

There are many types of signal generators that provide test signals for a variety of uses. Typically, a signal generator includes an amplitude control system that sets and maintains the amplitude, or level, of test signals provided by the signal generator at a test port. However, in some uses of the signal generator, signal conditioners, such as amplifiers, mixers, limiters, or filters are connected to the test port to further condition the test signal. Often, these signal conditioners are external to the signal generator. For example, when an external amplifier is connected to the test port, a conditioned signal is provided at the output of the amplifier that is an amplified version of the test signal provided by the signal generator at the test port. The amplitude control system is operated in either an internally-leveled configuration or an externally-leveled configuration in an attempt to set and maintain the amplitude of this conditioned signal at the output of the signal conditioner.

FIG. 1A shows an example of a prior art amplitude control system operating in the internally-leveled configuration. In this example, an external amplifier is coupled to the test port of the signal generator within which the amplitude control system is included. A signal separator 2 couples a portion of the signal 3 provided by a signal source to an internal detector before an input of the amplifier. The internal detector senses the coupled portion of the signal 3 and produces a detected signal 5 that corresponds to the amplitude of the signal 3 at the input of the amplifier. The detected signal 5 is received by an amplitude controller 4, such as an automatic level control circuit (ALC), which in response to the detected signal 5, drives the signal source to control the amplitude of the signal 3 that is applied to the amplifier. Thus, the amplitude of the conditioned signal 7 at the output of the amplifier is set by detecting and adjusting the amplitude of the signal 3 provided to the input of the amplifier.

Because the amplifier in this internally-leveled configuration is outside a feedback loop provided by the internal detector, the amplitude controller 4, and the signal source, gain drifts and non-linearities of the amplifier are not accommodated by the feedback loop. Thus, while the amplitude of the signal 3 present at the input to the amplifier is set and maintained in this internally-leveled configuration, the amplitude of the conditioned signal 7 provided at the output of the amplifier varies according to the gain drifts and other time-dependent instabilities of the amplifier. Non-linearities such as distortion, saturation or compression in the amplifier also result in amplitude changes at the output of the amplifier that do not correspond to changes in the amplitude of the signal 3, which makes it difficult to control the amplitude of the conditioned signal 7 at the output of the amplifier by adjusting the amplitude of the signal 3 provided at the input of the amplifier.

In addition, when the prior art amplitude control system is included in a signal generator for use with a network analyzer, the gain drifts and non-linearities of the amplifier cause amplitude tracking errors between the conditioned signal 7 applied to a device under test (DUT) and a reference signal 9 derived from the signal 3 via a signal coupler 6. Because accurate amplitude tracking of the reference signal 9 and conditioned signal 7 is relied upon to determine the amplitude of the conditioned signal 7 applied to the DUT, the amplitude tracking errors degrade the accuracy of the network analyzer with which the signal generator is used. Further, in this internally-leveled configuration, the impedance match $Z_{OUT}$ presented to the DUT is determined primarily by the output impedance of the amplifier and does not benefit from an improved impedance match that would be provided to the DUT were the amplifier included within the feedback loop.

FIG. 1B shows an example of the prior art amplitude control system operating in the externally-leveled configuration with the external amplifier, an external coupler and external detector coupled to the test port. The external coupler couples a portion of the conditioned signal 7 provided at the output of the amplifier to the external detector. The external detector senses the coupled portion of the conditioned signal 7 and produces a detected signal 11 that corresponds to the amplitude of the conditioned signal 7 at the output of the amplifier. The detected signal 11 from the external detector is provided to the amplitude controller 4 through a selection switch or other multiplexer (not shown). In response to the detected signal 11 from the external detector, the amplitude controller 4 drives the signal source to control the amplitude of the signal 3 to achieve a designated amplitude setting of the conditioned signal 7 provided to the DUT.

Because the amplifier in this externally-leveled configuration is within the feedback loop provided by the external detector, amplitude controller 4, and the signal source, gain drifts and non-linearities of the amplifier are accommodated by the feedback loop so that the effects of these amplifier characteristics on the amplitude of the conditioned signal 7 are suppressed by the feedback loop. However, when the prior art amplitude control system is included in a signal generator for use with a network analyzer, the amplitude tracking error between the conditioned signal 7 at the output of the amplifier and the reference signal 9 still results due to the inherent non-linearities of the amplifier. This amplitude tracking error that results in the externally-leveled configuration makes the prior art amplitude control system not well-suited for signal generators that are used with network analyzers. In addition, since the amplitude controller 4 is typically calibrated for transfer characteristics of the internal detector, offset and linearity errors result in the amplitude of the conditioned signal 7 when the amplitude of the conditioned signal 7 is set according to the detected signal 11 from the external detector. These errors in amplitude settings result from the external detector having a transfer function that is generally different from the transfer function of the internal detector for which the amplitude controller 4 is calibrated.

There is a need in signal generators to overcome the amplitude tracking errors, the difficulties in setting the amplitude of the conditioned signals 7, and other shortcomings that result when amplifiers and other signal conditioners are included in the prior art amplitude control systems shown in FIGS. 1A–1B.

SUMMARY OF THE INVENTION

A configurable feedback path constructed according to the preferred embodiment of the present invention is included in an amplitude control system of a signal generator having a signal source and an amplitude controller. The configurable feedback path provides accurate tracking between a signal provided at a test port and a reference signal, whether or not an amplifier or other signal conditioner is coupled to the test port.

The configurable feedback path includes a series of access ports and includes a detector that has an input coupled to a first access port, a filtered output coupled to the amplitude controller, and an unfiltered output providing the reference signal. A signal separator, also included in the configurable feedback path, has an input terminal coupled to the signal source, a coupled terminal that is coupled to a second access port, and a thru-terminal coupled to a third access port. A fourth access port is coupled to the test port.

With the configurable feedback path arranged for an internally-leveled configuration of the amplitude control system, a first jumper couples the first access port to the second access port, and a second jumper couples the third access port to the fourth access port. The second jumper provides the signal from the signal source to the test port. The first jumper provides a coupled version of the signal from the signal source to the input of the detector. The detector generates a detected signal at the filtered output that corresponds to the amplitude of this coupled signal from the signal source. The amplitude controller receives the detected signal and sets the amplitude of the signal from the signal source in response to the detected signal. The detector also provides the coupled version of the signal from the signal source at the unfiltered output to provide the reference signal that accurately tracks the signal from the signal source provided to the test port via the second jumper.

With the configurable feedback path arranged for an externally-leveled configuration of the amplitude control system, a signal conditioner is coupled to the third access port, receiving the signal from the signal source. The signal conditioner provides a conditioned signal to a signal separator. A thru output of the signal separator is coupled to the fourth access port to provide the conditioned signal at the test port. A coupled output of the signal separator is coupled to the first access port, providing a coupled version of the conditioned signal to the input of the detector. The detector generates a detected signal at the filtered output that corresponds to the amplitude of the coupled conditioned signal. The amplitude controller receives the detected signal and sets the amplitude of the signal from signal source in response to the detected signal to establish the amplitude of the conditioned signal at the test port. The detector provides this coupled conditioned signal at the unfiltered output to provide the reference signal that accurately tracks the conditioned signal present at the test port.

DETAILED DESCRIPTION OF THE EMBODIMENT

Figure 1A:
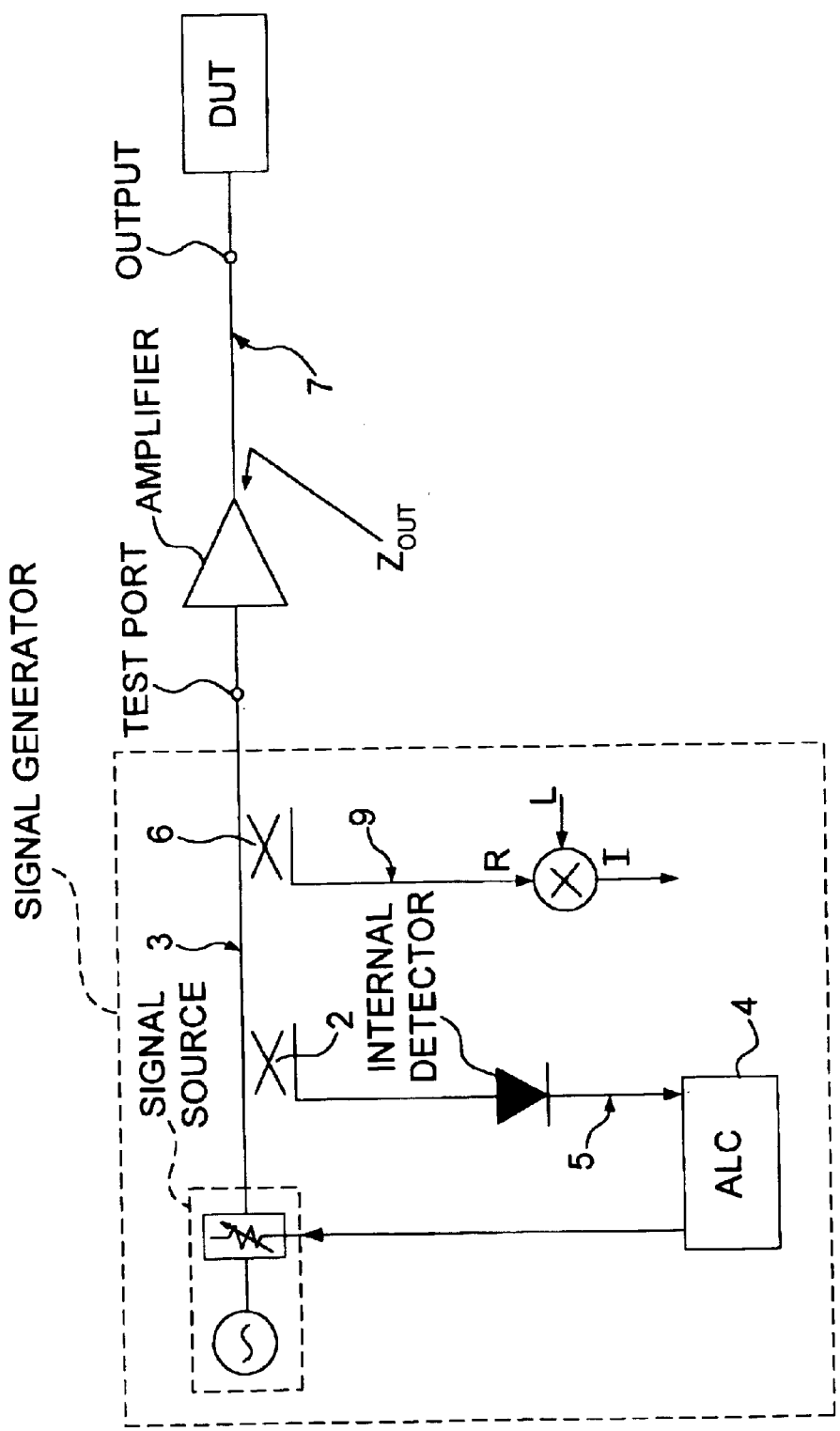
FIG. 1A shows a prior art amplitude control system in an internally-leveled configuration.
Figure 1B:
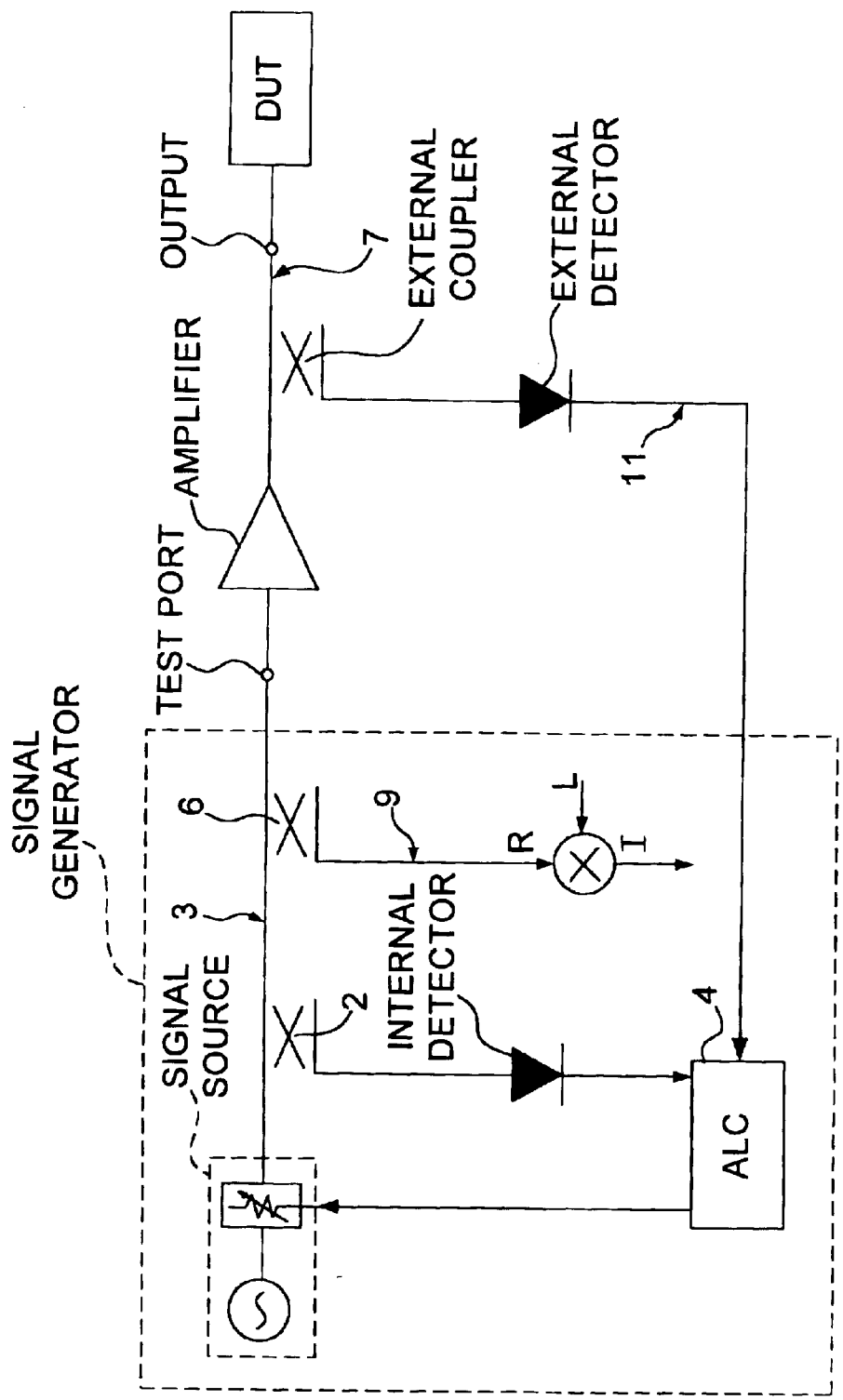
FIG. 1B shows the prior art amplitude control system in an externally-leveled configuration.
Figure 2:
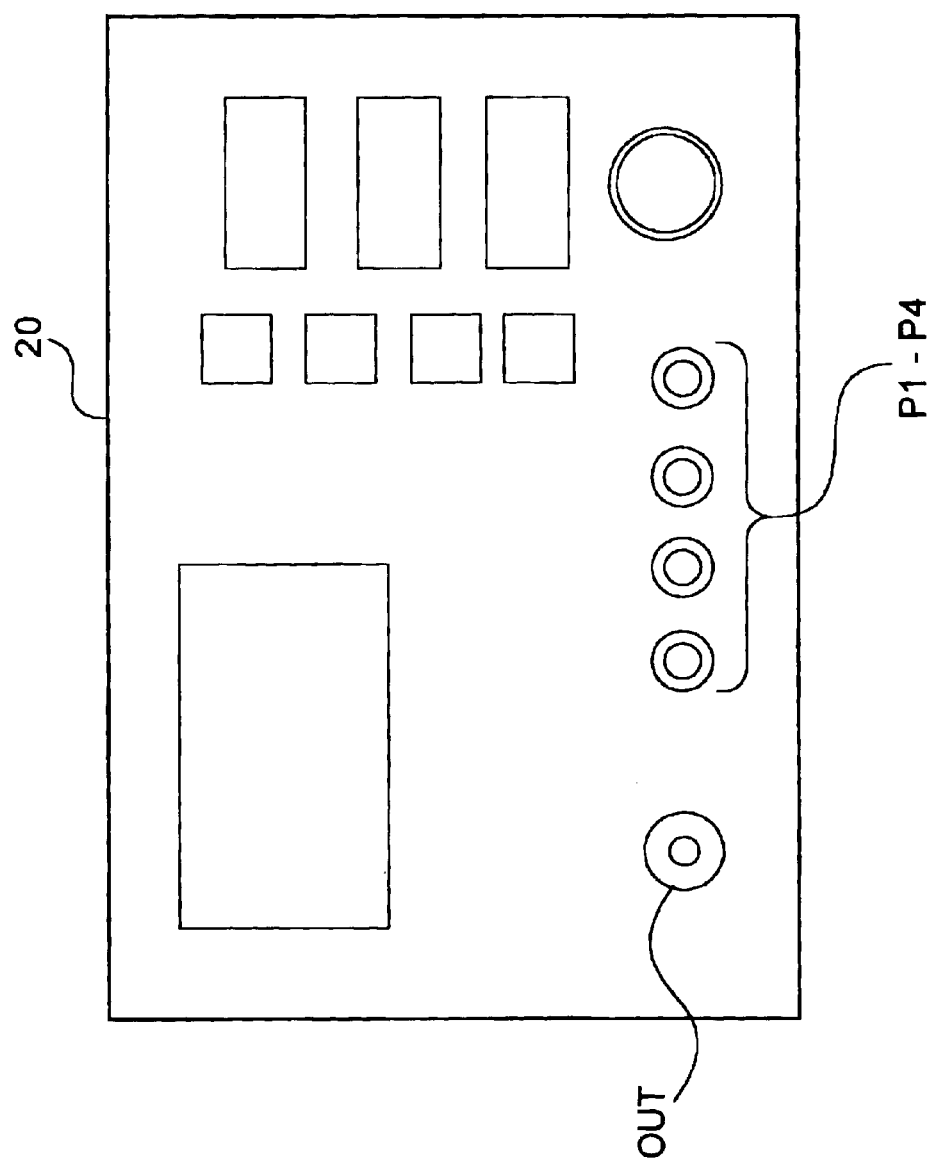
FIG. 2 shows a signal generator including an amplitude control system having a configurable feedback path constructed according to the preferred embodiment of the present invention.

FIG. 2 shows a signal generator 20 including an amplitude control system having a configurable feedback path constructed according to the preferred embodiment of the present invention. The signal generator 20 is an instrument or system that provides electrical signals at a test port OUT. However, electrical-to-optical converters, piezo-electric devices or other signal transducers integrated with the signal generator 20 enable the signal generator 20 to process or accommodate signals that are optical, acoustical, or mechanical in nature. The signal generator 20 is a stand-alone instrument or system, or the signal generator 20 is integrated in, or used in conjunction with, other instruments or systems, such as network analyzers, spectrum analyzers, or other types of signal analyzers, signal processors, or signal measurement systems.

In addition to the test port OUT, the signal generator 20 that includes the configurable feedback path has a series of access ports. While four access ports P1–P4 are shown, additional access ports are optionally included for applying modulation, or receiving or providing references for phase-locking or other applications. The access ports P1–P4 are panel-mounted SMA connectors, which have widespread use in radio frequency (RF) and microwave systems. However, N-type connectors, BNC connectors, SMC connectors, 2.4 mm connectors or other types of coaxial connectors are also suitable for the access ports P1–P4, and are typically selected based on the frequency range of the signals accommodated by the signal generator 20. The access ports P1–P4 alternatively include a multi-pin connector, cable terminations, printed circuit board connectors, or other suitable connection elements that enable matings with complementary connection elements.

Figure 3A:
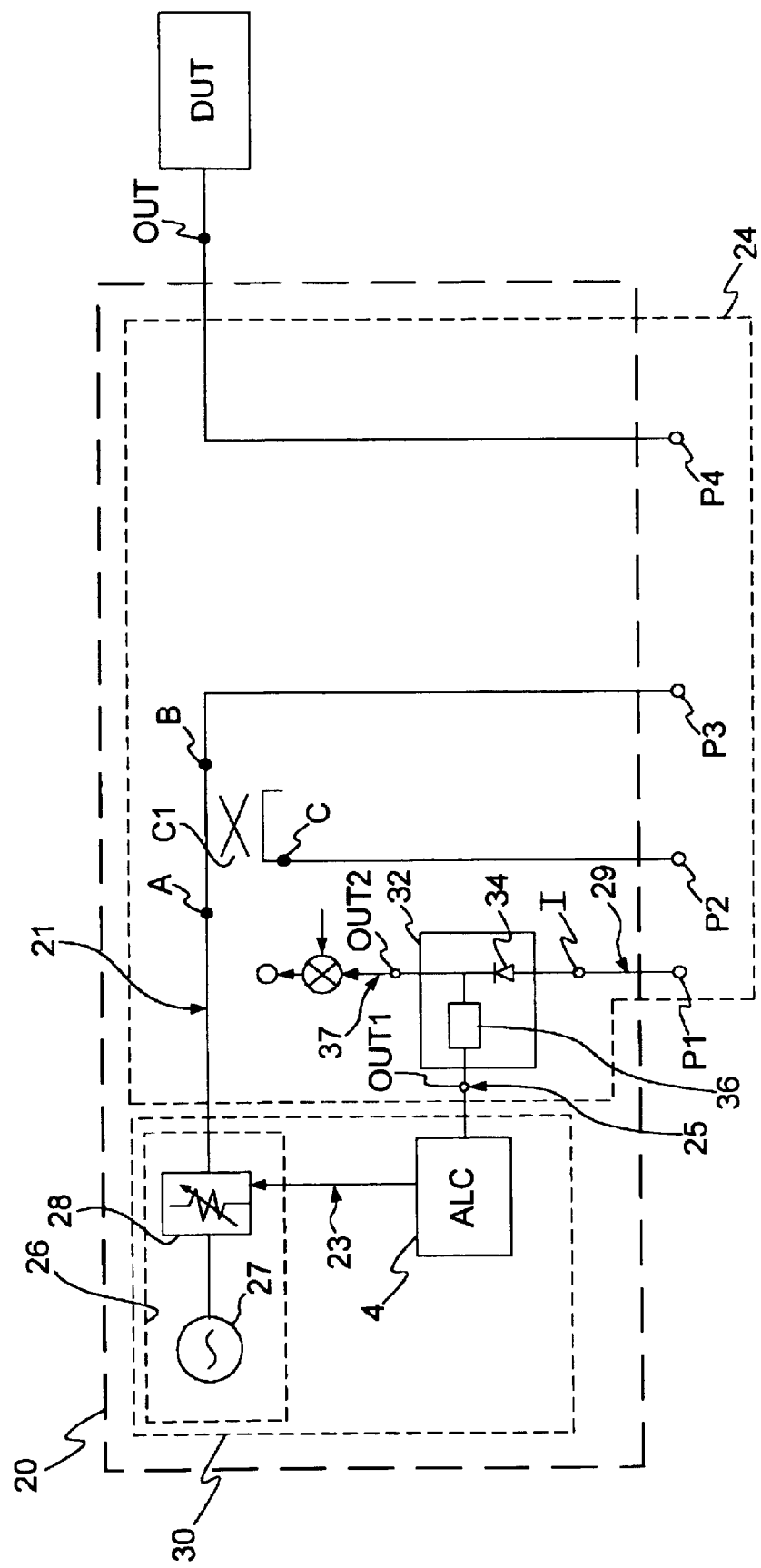
FIG. 3A shows the amplitude control system having a configurable feedback path constructed according to the embodiment of the present invention.

FIG. 3A shows the amplitude control system 30 having the configurable feedback path 24 constructed according to the preferred embodiment of the present invention. The amplitude control system 30 includes a signal source 26 and an amplitude controller 4. The signal source 26 includes an oscillator, signal synthesizer, or other signal generation system 27 that provides a signal 21. The signal source 26 also includes an amplitude modulator 28, either separate from or integrated within the signal generation system 27, that adjusts the amplitude of the signal 21 according to a control signal 23 provided by the amplitude controller 4. The amplitude modulator 28 is typically an attenuator implemented using PIN diodes or other solid state devices such as GaAs FETs, or the amplitude modulator 28 is a variable gain element such as a voltage-controlled or current-controlled amplifier. However, mechanical attenuators, or any other device, system or element suitable for adjusting the amplitude of the signal 21 in response to the control signal 23 is alternatively used.

The amplitude controller 4 is shown as an automatic level control circuit (ALC) that receives a detected signal 25 and provides the appropriate control signal 23 to the amplitude modulator 28. A typical configuration of the amplitude controller 4 (shown in FIG. 3B) includes a comparator, integrator, or other high-gain element 50 that compares the detected signal 25 to an internal reference 51 to generate an error signal 53 indicative of any differences between the detected signal 25 and the reference 51. The control signal 23 is derived from the error signal 53 by a shaping circuit 54, such as an exponentiator or gain/offset adjuster. The control signal 23 drives the amplitude modulator 28 of the signal source 26 to minimize the error signal 53. In a balanced configuration of the amplitude control system 30, the error signal 53 is minimized, thereby minimizing differences between the detected signal 25 and the reference 51. Since the reference 51 is typically preset to a designated level, the amplitude of the signal 21 provided by the signal source 26 is adjusted in response to the detected signal 25, so that the differences between the detected signal 25 and the reference 51 are minimized.

Figure 3B:
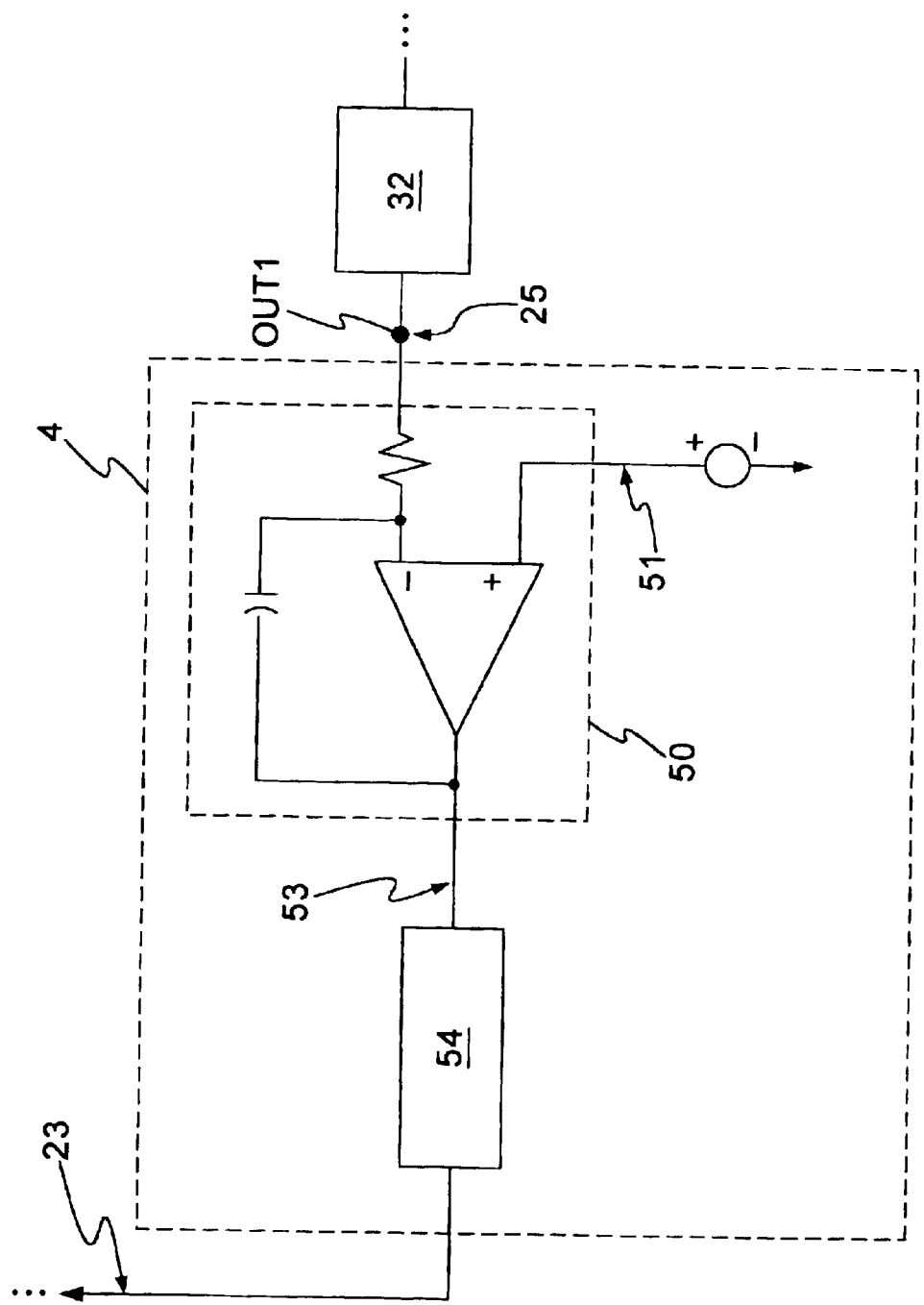
FIG. 3B shows an example of an amplitude controller of the amplitude control system.

While a typical amplitude controller 4 is shown in FIG. 3B, amplitude controllers 4 are well known in the art and the configurable feedback path 24 is suitable for inclusion in many types of amplitude control systems 30. As examples of suitable amplitude control systems 30, including a variety of amplitude controllers 4 and signal sources 26, are those of the 867000 Signal Synthesizers, and the model 8648C Signal Generators, provided by AGILENT TECHNOLOGIES, INC., Palo Alto, Calif., USA. Suitable amplitude control systems 30 are also taught by U.S. Pat. No. 5,661,442 to Sparks, and U.S. Pat. No. 4,966,500 to Larson et al.

In addition to the access ports P1–P4, the configurable feedback path 24 includes a detector 32. The detector 32 has an input I that is coupled to the first access port P1 and a filtered output OUT1 that is coupled to the amplitude controller 4. The filtered output OUT1 of the detector 32 provides detected signals 25, such as voltages or currents, that indicate the amplitude of signals 29 that are applied to the input I of the detector 32. The correspondence between the detected signals 25 at the filtered output OUT1 and the amplitude of the signals 29 applied to the input I is typically a non-linear transfer function that is particular to the type of detector 32 included in the configurable feedback path 24. In this example, the detector 32 includes a Schottke diode, PDB diode, crystal detector, thermocouple device, or other suitable sensor 34.

The detector 32 also has an unfiltered output OUT2. At the unfiltered output OUT2, the detector 32 passes through signals 29 that are applied to the input I of the detector 32 to provide at the unfiltered output OUT2, a reference signal 37 that closely tracks characteristics, such as the amplitude and frequency, of the signals 29 that are applied to the input I of the detector 32. The filtered output OUT1 and unfiltered output OUT2 of the detector 32 are typically provided by a bridge circuit 36 or structure cascaded with the diode or sensor 34 included in the detector 32. In one example, the detector 32 is implemented using an AGILENT TC677 GaAs Integrated 0.01–75 GHz Directional Detector, provided by AGILENT TECHNOLOGIES, INC., Palo Alto, Calif., USA.

A signal separator C1, also included in the configurable feedback path 24 has an input terminal A coupled to the signal source 26, a thru-terminal B coupled to the third access port P3, and a coupled terminal C that is coupled to the second access port P2. The signal separator C1 is typically a resistive bridge, power splitter, signal sampler, balun or coupler, including these three terminals. The coupled terminal C taps off, or samples, a designated portion of the signals 21 that are applied to the input terminal A of the signal separator C1. The fourth access port P4 of the configurable feedback path 24 is coupled to the test port OUT.

Figure 4:
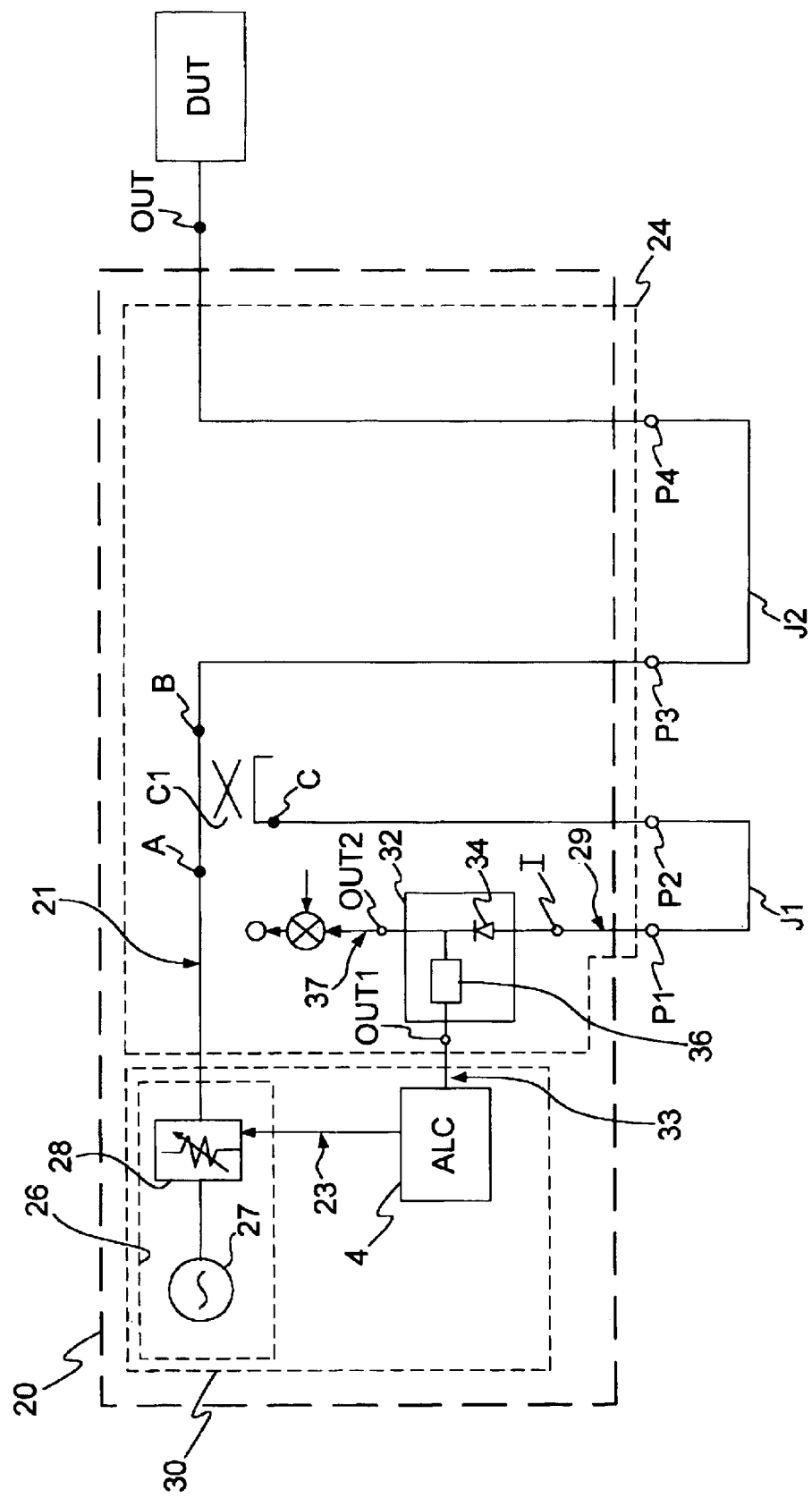
FIG. 4 shows the amplitude control system of FIG. 3 in an internally-leveled configuration.

With the configurable feedback path 24 arranged for an internally-leveled configuration of the amplitude control system 30, as shown in FIG. 4, a jumper J1 couples the first access port P1 to the second access port P2. A jumper J2 couples the third access port P3 to the fourth access port P4. The jumper J2 provides the signal 21 from the signal source 26 to the test port OUT whereas the jumper J1 provides a signal 29 coupled from the signal 21 provided by the signal source 26 to the input I of the detector 32. The detector 32 generates a detected signal 33 at the filtered output OUT1 that corresponds to the amplitude of the coupled signal 29. The amplitude controller 4 receives the detected signal 33 from the filtered output OUT1 and adjusts the amplitude of the signal 21 from the signal source 26 in response to the detected signal 33.

At the unfiltered output OUT2, the detector 32 provides a reference signal 37 that tracks the signal 21 from the signal source 26 provided at the test port OUT via the jumper J2, by routing the signal 29 to the input I of the detector 32 through jumper J1. The jumpers J1, J2 in this example are coaxial transmission lines compatible with the connectors used for the access ports P1–P4. However, any other transmission structures or media suitable for coupling signals between various ones of the access ports P1–P4 are alternatively used as the jumpers J1, J2.

Figure 5:
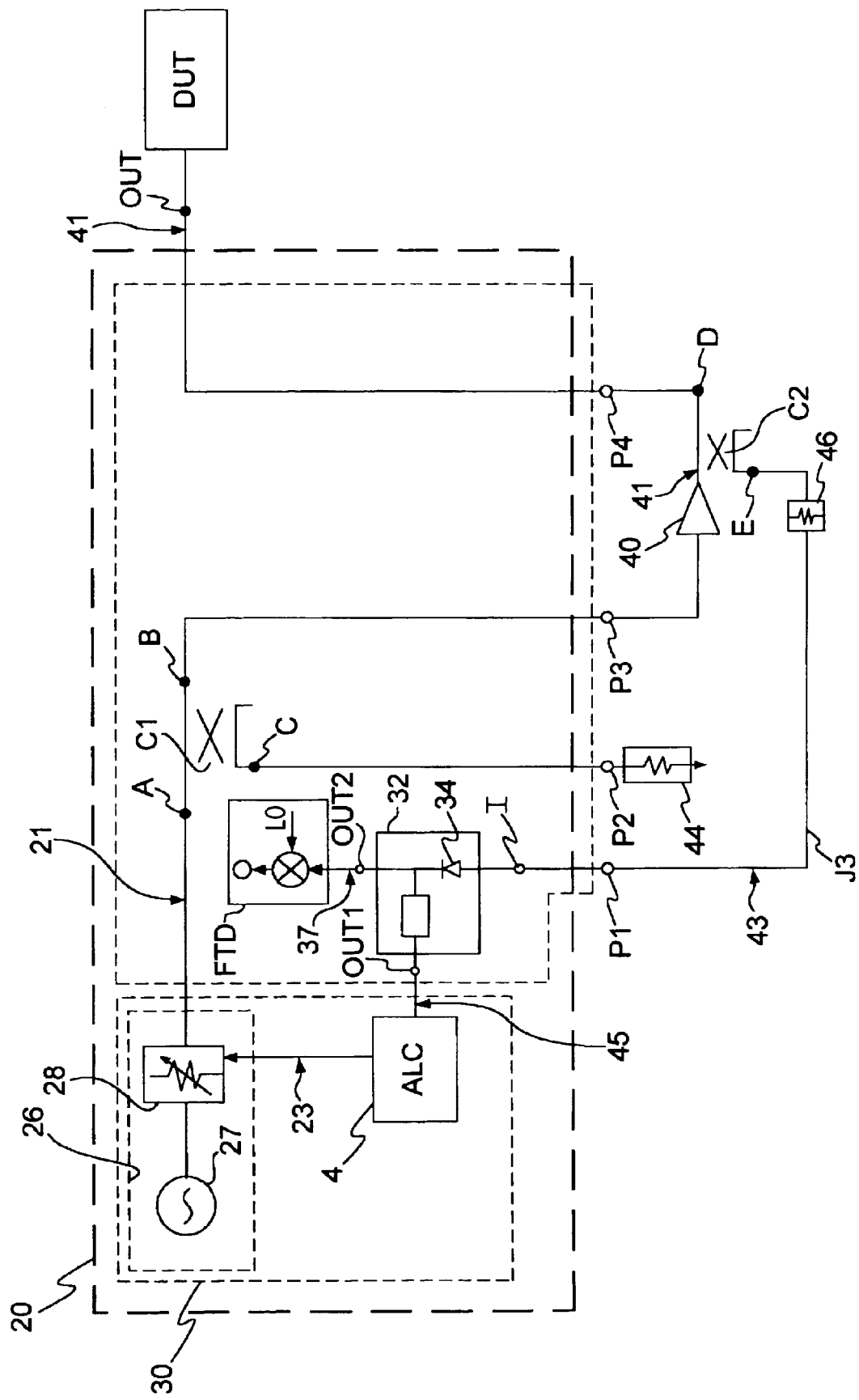
FIG. 5 shows the amplitude control system of FIG. 3 in an externally-leveled configuration.

FIG. 5 shows the amplitude control system 30 of FIG. 3A in an externally-leveled configuration. This configuration of the amplitude control system 30 is typically used when a signal conditioner 40 is used to further process or condition the signal 21 provided by the signal source 26 to produce a conditioned signal 41 at the test port OUT. While in this example the signal conditioner 40 is an amplifier that is external to the signal generator 20, the signal conditioner 40 alternatively includes one or more amplifiers, mixers, limiters, filters, or other devices, systems, or components that are internal to or external from the signal generator 20.

The signal conditioner 40 is coupled between the third access port P3 that receives the signal 21 from the signal source 26, and a signal separator C2. A thru-output D of the signal separator is coupled to the fourth access port P4 to provide the conditioned signal 41 at the test port OUT. Alternatively, the signal conditioner 40 is not coupled to the access port P4 and the conditioned signsl 41 is available for use at the access port P4. The signal separator C2 also has a coupled output E that is coupled to the first access port P1 via a jumper J3, providing a coupled conditioned signal 43 to the input I of the detector 32.

The detector 32 generates a detected signal 45 at the filtered output OUT1 corresponding to the amplitude of the coupled conditioned signal 43. The amplitude controller 4 receives the detected signal 45 and sets the amplitude of the signal 21 from signal source 26 in response to the detected signal 45 to establish the amplitude of the conditioned signal 41 at the test port OUT. At the unfiltered output OUT2, the detector 32 provides the reference signal 37 that tracks the conditioned signal 41 by the routing of the coupled conditioned signal 43 that is coupled through the coupled output E of the signal separator C2 via the jumper J3 to the input I of the detector 32.

Optionally, a termination 44 is coupled to second access port P2 to terminate the coupled terminal C of the signal separator C1. Typically, the termination 44 is an absorptive load that is impedance-matched to the coupled terminal C of the signal separator C1, although other terminations, such as short circuit loads or other transmission structures, or devices are alternatively used depending on the coupling factor between the coupled terminal C and the thru-terminal B of the signal separator C1.

A frequency translation device FTD, such as a mixer, up-converter, down-converter or other system used to translate the frequency of the reference signal 37, is optionally coupled to the unfiltered output OUT2 of the detector 32 to enable the reference signal 37 to be mixed, or translated to an intermediate frequency (IF) via application of the reference signal 37 and a local oscillator (LO) signal to the FTD.

The accurate tracking between the reference signal 37 and the signals 21, 41 at the test port OUT in the internally-leveled configuration and the externally-leveled configuration, respectively, makes the signal generator 20 using the configurable feedback path 24 well-suited for use with a network analyzer, spectrum analyzer or other type of signal analyzer, signal processor, or signal measurement system that relies on signal tracking.

Since the detector 32 is used in both the internally-leveled and externally-leveled configurations of the configurable feedback path 24, setting of the amplitude of the signals 21, 41 at the test port OUT is readily achieved. An optionally included gain adjustment device 46 coupled between the coupled output E of the signal separator C2 and the first access port P1 in the externally-leveled configuration of the configurable feedback path 24, provides that the coupled conditioned signal 43 has an amplitude range that is compatible with the detector 32.

While the embodiment of the present invention has been illustrated in detail, it should be apparent that modifications and adaptations to this embodiment may occur to one skilled in the art without departing from the scope of the present invention as set forth in the following claims.

What is claimed is:

1. A configurable feedback path for an amplitude control system having a signal source and an amplitude controller, the configurable feedback path comprising:

a series of access ports;

a detector having an input coupled to a first access port, a filtered output coupled to the amplitude controller, and an unfiltered output;

a signal separator having an input terminal coupled to the signal source, a coupled terminal coupled to a second access port, and a thin terminal coupled to a third access port;

wherein in a first configuration, the configurable feedback path includes a first jumper coupling the first access port to the second access port to provide a coupled signal from a signal source to the input of the detector, the detector generating a detected signal at the filtered output that corresponds to an amplitude of the coupled signal and providing at the unfiltered output the coupled signal that tracks a signal from the signal source at a fourth access port, and a second jumper coupling the third access port to the fourth access port to provide the signal from the signal source to the test port; and wherein in a second configuration, the configurable feedback path includes a signal conditioner having a first terminal coupled to the third access port receiving a signal from the signal source and providing a conditioned signal at a second terminal, a coupler having an input coupled to the second terminal, having a thru output coupled to the fourth access port to provide the conditioned signal at the fourth access port, and having a coupled output coupled to the first access port, providing a coupled conditioned signal to the input of the detector, the detector generating a detected signal at the filtered output corresponding to an amplitude of the coupled conditioned signal and providing the coupled conditioned signal at the unfiltered output that tracks the conditioned signal, the amplitude controller receiving the detected signal and adjusting an amplitude of the signal from signal source in response to the detected signal to establish an amplitude of the conditioned signal at the fourth access port.

2. The configurable feedback path of claim 1 wherein the fourth access port is coupled to a test port.

3. The configurable feedback path of claim 1 further comprising a frequency translation device coupled to the unfiltered output of the detector.

4. The configurable feedback path of claim 1 wherein the series of access ports, the detector and the signal separator are included within a signal generator.

5. The configurable feedback path of claim 1 wherein the signal conditioner includes an amplifier.

6. The configurable feedback path of claim 1 wherein the detector includes a sensor and a bridge circuit.

7. The configurable feedback path of claim 1 further including a gain adjustment device interposed between the coupled output of the coupler and the input of the detector.

* * * * *

UNITED STATES PATENT AND TRADEMARK OFFICE
CERTIFICATE OF CORRECTION

PATENT NO. : 6,946,910 B2
DATED : September 20, 2005
INVENTOR(S) : Chi

It is certified that error appears in the above-identified patent and that said Letters Patent is hereby corrected as shown below:

Column 7,
Line 42, delete "thin" and insert -- thru --.

Signed and Sealed this

Fourteenth Day of March, 2006

JON W. DUDAS
*Director of the United States Patent and Trademark Office*